United States Patent
Chapuis

(10) Patent No.: US 6,958,592 B2
(45) Date of Patent: Oct. 25, 2005

(54) ADAPTIVE DELAY CONTROL CIRCUIT FOR SWITCHED MODE POWER SUPPLY

(75) Inventor: Alain Chapuis, Morgan Hill, CA (US)

(73) Assignee: Power-One, Inc., Camarillo, CA (US)

(*) Notice: Subject to any disclaimer, the term of this patent is extended or adjusted under 35 U.S.C. 154(b) by 140 days.

(21) Appl. No.: 10/724,509

(22) Filed: Nov. 26, 2003

(65) Prior Publication Data

US 2005/0110475 A1 May 26, 2005

(51) Int. Cl.[7] ............................................. G05F 1/40
(52) U.S. Cl. ...................... 323/246; 323/284; 327/161
(58) Field of Search ................................ 323/225, 237, 323/242, 244, 246, 284, 285, 288; 327/157, 327/158, 161, 163

(56) References Cited

U.S. PATENT DOCUMENTS

| | | |
|---|---|---|
| 3,660,672 A | 5/1972 | Berger et al. |
| 4,194,147 A | 3/1980 | Payne et al. |
| 4,538,073 A | 8/1985 | Freige et al. |
| 4,538,101 A | 8/1985 | Shimpo et al. |
| 4,622,627 A | 11/1986 | Rodriguez et al. |
| 4,654,769 A | 3/1987 | Middlebrook |
| 5,053,920 A | 10/1991 | Staffiere et al. |
| 5,073,848 A | 12/1991 | Steigerwald et al. |
| 5,377,090 A | 12/1994 | Steigerwald |
| 5,481,140 A | 1/1996 | Maruyama et al. |
| 5,532,577 A | 7/1996 | Doluca |
| 5,627,460 A | 5/1997 | Bazinet et al. |
| 5,905,370 A | 5/1999 | Bryson |
| 5,943,227 A | 8/1999 | Bryson et al. |
| 5,990,669 A | 11/1999 | Brown |
| 6,057,607 A | 5/2000 | Rader, III et al. |
| 6,157,182 A | 12/2000 | Tanaka et al. |
| 6,191,566 B1 | 2/2001 | Petricek et al. |
| 6,211,579 B1 | 4/2001 | Blair |
| 6,262,900 B1 | 7/2001 | Suntio |
| 6,396,250 B1 | 5/2002 | Bridge |
| 6,421,259 B1 | 7/2002 | Brooks et al. |
| 6,429,630 B2 | 8/2002 | Pohlman et al. |
| 2001/0033152 A1 | 10/2001 | Pohlman et al. |
| 2002/0073347 A1 | 6/2002 | Zafarana et al. |
| 2003/0122429 A1 | 7/2003 | Zhang et al. |
| 2003/0142513 A1 | 7/2003 | Vinciarelli |

(Continued)

OTHER PUBLICATIONS

33702 Microprocessor Power Supply (3.0A) Analog Products MC33702 Fact Sheet; Motorola/ Digital dna/ Power Management Switching; pp. 1-4, no date.

(Continued)

*Primary Examiner*—Jessica Han
(74) *Attorney, Agent, or Firm*—O'Melveny & Myers LLP

(57) ABSTRACT

A switched mode power supply comprises a first switch coupled to an input power source, a second switch coupled to ground, and an output filter coupled to a phase node defined between the first and second switches. The first and second switches are responsive to a pulse width modulated signal to thereby regulate power provided to the output filter. A controller is provided in a feedback loop that monitors operation of the first and second switches and delays activation of one of the first and second switches to preclude simultaneous conduction. The controller comprises at least one delay control circuit adapted to delay delivery of the pulse width modulated signal to at least one of the first and second switches. The delay control circuit detects a phase difference between state transitions of the first and second switches and provides a delay corresponding to a magnitude of the phase difference.

18 Claims, 4 Drawing Sheets

U.S. PATENT DOCUMENTS

2003/0201761 A1 10/2003 Harris
2004/0027101 A1 2/2004 Vinciarelli
2005/0093594 A1* 5/2005 Kim et al. .................. 327/158

OTHER PUBLICATIONS

"Motorola Switch Mode Power Supply With Multiple Linear Regulators And High Speed CAN Transceiver" Motorola, Inc. 2002; digital dna; Analog Marketing; Rev. 2.5, Nov. 2002; 33394; Multi-Output Power Supply Semiconductor Technical Data.

"Power Management Solutions For Networking Applications"; Presented by Luc Darmon Smart Networks Developer Forum 2003—Jun. 4-6 Euro-Disney Paris, France; Motorola digital dna; www.motorola.com/sndf; pp. 1-26.

Preliminary Information 1.5 A Switch-Mode Power Supply With Linear Regulator 33701; Power Supply Integrated Circuit; Motorola Semiconductor Technical Data Analog Marketing MC33701/D Rev. 1.0, May 2003; Motorola digital dna; pp. 1-24.

"The 1 2-C Bus Specification" Version 2.1; Jan. 2000; document order No.: 9398 393 40011; Phillips Semiconductors; pp. 1-46.

"System Management Bus Specification" Smart Battery System Specifications; Revision 1.1 Dec. 11, 1998; SBS Implementers Forum; Version 1.1; pp. 1-39.

"KEKB Power Supply Interface Controller Module" by A. Akiyama, T. Nakamura, M. Yoshida, T. Kubo, N. Yamamoto and T. Katoh KEK, High Energy Accelerator Research Organization, 1-1 Ohio, Tsukuba 305, Japan, no date.

"Magnet Power Supply Control System KEKB Accelerators" by T.T. Nakamura, A. Akiyama, T. Katoh, Ta. Kubo, N. Yamamoto, M. Yoshida, KEK, Tsukuba, Japan International Conference On Accelerator And Large Experimental Physics Control Systems, 1999, Trieste, Italy, pp. 406-408, no month.

"Electronics Products" by Paul Birman and Sarkis Nercessian, Kepco, Inc. Flushing NY vol. 37, No. 10, Electronic Products, Mar. 1995; The Engineer's Magazine of Product Technology; Power Supply Special; DSO Samples Single Shots at 10 Gsamples/s Speech Recognition On A Single Chip LCD Has Flat-Panel Benefits At CRT Cost Product Update: High-Performance OP AMPS; A Hearst Business Publication; pp. 1, 5, 33-34.

* cited by examiner

ADAPTIVE DELAY CONTROL CIRCUIT FOR SWITCHED MODE POWER SUPPLY

BACKGROUND OF THE INVENTION

1. Field of the Invention

The present invention relates to switched mode power supplies, and more particularly to a pulse width modulation control circuit for a switched mode power supply that provides adaptive delay control to prevent cross-conduction of high and low side switches during switch state transitions.

2. Description of Related Art

Switched mode power supplies are known in the art to convert an available direct current (DC) level voltage to another DC level voltage. A buck converter is one particular type of switched mode power supply that delivers a regulated DC output voltage to a load by selectively storing energy in an output inductor coupled to the load by switching the flow of current into the output inductor. The buck converter includes two power switches, referred to as high side and low side switches, that are typically provided by MOSFET transistors. The high side switch couples the output inductor to a positive supply voltage, and the low side switch couples the output inductor to ground. A pulse width modulation (PWM) control circuit is used to control the gating of the high and low side switches in an alternating manner to control the flow of current in the output inductor. The PWM control circuit uses signals communicated via a feedback loop reflecting the output voltage and/or current level to adjust the duty cycle applied to the power switches in response to changing load conditions.

In such a switched mode power supply, it is important to prevent simultaneous conduction of the high and low side switches. This would short the positive supply voltage to ground through the high and low side switches, potentially damaging the switches and otherwise reducing the conversion efficiency of the power supply. To prevent simultaneous conduction (also referred to as "cross conduction"), it is known to delay the low-to-high and high-to-low switch transitions by a period of time sufficient to ensure that one switch has shut off before the other switch is activated. One such control method uses comparators to detect the state of the high and low side switches and timers to define the maximal delay of the low-to-high and high-to-low transitions. Particularly, a first comparator senses the low side switch gate voltage and enables the high side switch to be turned on only after the low side switch is turned off (i.e., low side gate voltage below threshold voltage $V_{th2}$), and a second comparator senses the phase voltage and enables the low side switch to be turned on only after the high side switch is turned off (i.e., phase voltage below threshold voltage $V_{th1}$). The timers define the maximum delay between detection of low side switch turn off and high side switch turn on, and vice versa.

While this method prevents simultaneous conduction of the power switches, a drawback is that the time delays produce lengthy dead times during which neither switch is conducting. During these dead times, the inductor current will flow from ground through the body diode of the low side switch (or through a Shottky diode coupled in parallel with the low side switch) through the output inductor. The voltage drop across the body diode (or Shottky diode) tends to further reduce the conversion efficiency of the power supply. Moreover, the method is only responsive to load changes and input voltage changes, but cannot compensate for varying propagation delays in the power supply circuit due to temperature changes or silicon process changes.

Another control method enables the transition of the low side switch compared to the high side switch to be moved forward and back. The method utilizes a control loop that includes a digital delay line controlled by a multiplexer. A comparator senses the drain-source voltage of the low side switch and adjusts via an up/down counter (or loop filter) the amount of delay applied by the digital delay line to the turn on of the low side switch. This way, the low side switch is turned on when the phase voltage reaches zero regardless of internal or external propagation delays. While this control method is adaptive, the quantized delay is not "quiet" since the delay line will often bounce between two adjacent delay settings, thereby introducing noise in the pulse width modulation signal and hence the output voltage of the power supply. Moreover it is difficult to sense the drain-source voltage of the low side switch in order to detect the starting point of body diode conduction because of parasitic inductances. An inaccurate measurement of the zero voltage transition will affect the operation of the control loop.

Accordingly, there is a continuing need for adaptive delay control for a switched mode power supply that prevents cross conduction of the high and low side switches while also minimizing the dead times between switch transitions.

SUMMARY OF THE INVENTION

The present invention satisfies the need for an adaptive delay control for a switched mode power supply that prevents cross conduction of the high and low side switches while also minimizing the dead times between switch transitions.

In an embodiment of the invention, a switched mode power supply comprises a first switch coupled to an input power source, a second switch coupled to ground, and an output filter coupled to a phase node defined between the first and second switches. The first and second switches are responsive to a pulse width modulated signal to thereby regulate power provided to the output filter. A feedback loop monitors operation of the first and second switches and delays activation of one of the first and second switches to preclude simultaneous conduction and minimize dead time between state transitions of the first and second switches. The feedback loop comprises at least one delay control circuit adapted to delay delivery of the pulse width modulated signal to at least one of the first and second switches. The delay control circuit detects a phase difference between state transitions of the first and second switches and provides a delay corresponding to a magnitude of the phase difference.

More particularly, the at least one delay control circuit further comprises a first delay control circuit associated with said first switch and a second delay control circuit associated with said second switch. Each delay control circuit further comprises a phase detector providing an up or down signal proportional to the phase difference. A charge pump is coupled to the phase detector and converts the up or down signal to a control voltage. An analog delay device provides a time delay corresponding to the control voltage. A capacitor coupled to the charge pump integrates the control voltage to shape the feedback loop transfer function.

A more complete understanding of the adaptive delay control circuit for a switched mode power supply will be afforded to those skilled in the art, as well as a realization of additional advantages and objects thereof, by a consideration of the following detailed description of the preferred embodiment. Reference will be made to the appended sheets of drawings, which will first be described briefly.

DETAILED DESCRIPTION OF THE PREFERRED EMBODIMENT

The present invention provides an adaptive delay control for a switched mode power supply that prevents cross conduction of the high and low side switches while also minimizing the dead times between switch transitions. In the detailed description that follows, like element numerals are used to describe like elements illustrated in one or more figures.

Figure 1:
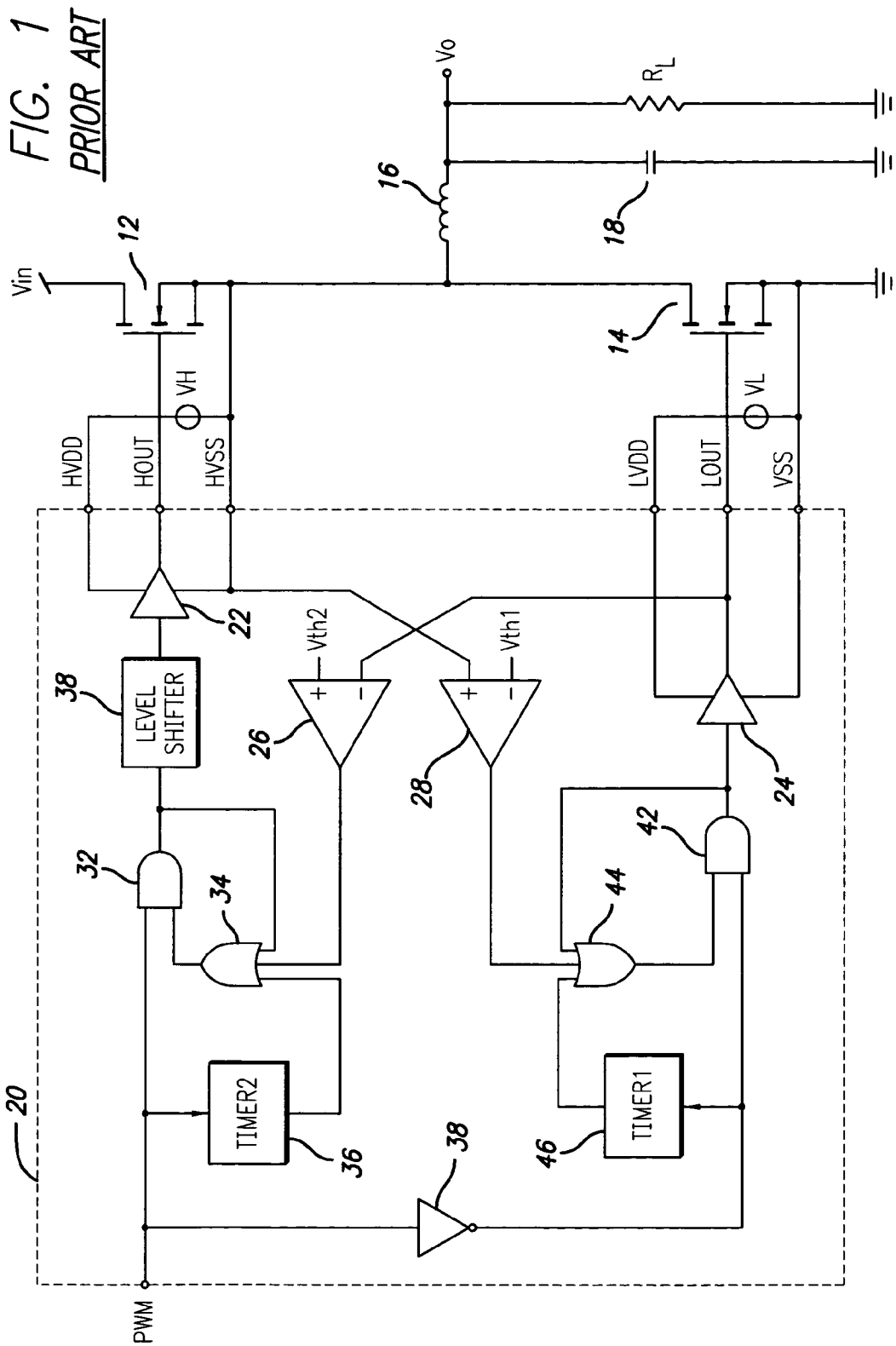
FIG. 1 depicts a switched mode power supply having a switch driver delay control circuit in accordance with the prior art.

Referring first to FIG. 1, an example of a conventional delay control circuit for a switched mode power supply is shown. The power supply comprises a buck converter topology used to convert an input DC voltage $V_{in}$ to an output DC voltage $V_o$ applied to a resistive load ($R_L$). The input DC voltage $V_{in}$ may further comprise an output of a galvanic isolation transformer of a DC-to-DC converter. The power supply includes high side switch 12, low side switch 14, output inductor 16, and capacitor 18. The drain terminal of the high side switch 12 is coupled to the input voltage $V_{in}$, the source terminal of the low side switch 14 is connected to ground, and the source terminal of the high side switch 12 and the drain terminal of the low side switch 14 are coupled together to define a phase node. The output inductor 16 is coupled in series between the phase node and the terminal providing the output voltage $V_o$, and a capacitor 18 is coupled in parallel with the resistive load $R_L$. A pulse width modulation (PWM) circuit (not shown) controls the duty cycle of a square wave signal used to control the activation time of the power switches 12, 14. Feedback signals reflecting the output voltage $V_o$ and/or current may determine the duty cycle of the PWM signal. The opening and closing of the power switches 12, 14 provides an intermediate voltage having a generally rectangular waveform at the phase node, and the filter formed by the output inductor 16 and capacitor 18 converts the rectangular waveform into the substantially DC output voltage $V_o$.

A voltage control delay circuit 20 delays delivery of the PWM signals to the power switches 12, 14. Inverter 38 inverts the PWM signal so that the high and low side switches 12, 14 are driven out of phase. The control circuit 20 further includes buffer drivers 22, 24 that provide respective driving signals to the gate terminals of the power switches 12, 14. Comparator 26 senses the gate voltage of the low side switch 14 and compares that voltage to a threshold voltage $V_{th2}$. Likewise, comparator 28 senses the phase voltage between the high and low side switches 12, 14 and compares that voltage to a threshold voltage $V_{th1}$. On the low side, buffer driver 24 is in turn driven by circuitry that includes AND gate 42, OR gate 44, and timer 46. The OR gate 44 receives inputs from the timer 46, comparator 28, and a feedback signal from AND gate 42. AND gate 42 receives inputs from the inverter 38 and the AND gate 44. Similarly, on the high side, buffer driver 22 is in turn driven by circuitry that includes AND gate 32, OR gate 34, and timer 36. The OR gate 34 receives inputs from the timer 36, comparator 26, and a feedback signal from AND gate 32. AND gate 32 receives inputs from the PWM signal and the AND gate 44. The high side may further include a level shifter 38 to adjust the voltage level applied to buffer driver 22, which is isolated from ground.

An operational cycle begins when the PWM signal changes state, which causes the timers 36, 46 to be initiated. Then, when the phase voltage drops below the threshold voltage $V_{th1}$, indicating that the high side switch 12 has shut off, comparator 28 provides a high signal to OR gate 44, causing the OR gate 44 to change state and provide a high signal to AND gate 42. If the comparator 28 does not provide a high signal, the timer 46 will provide a high signal to the OR gate 44 after a predetermined period of time following initiation, causing the OR gate 44 to change state and provide a high signal to AND gate 42. In turn, AND gate 42 issues a high signal that is passed through to buffer driver 24, which then provides a driving signal to low side switch 14. The feedback signal from the output of AND gate 42 to input of OR gate 44 maintains the OR gate 44 in a high state until such time that the PWM signal changes state, which causes the output of the AND gate 42 to go low.

Conversely, when the gate voltage of the low side switch 14 drops below the threshold voltage $V_{th2}$, indicating that the low side switch 14 has shut off, comparator 26 provides a high signal to OR gate 34, causing the OR gate 34 to change state and provide a high signal to AND gate 32. If the comparator 26 does not provide a high signal, the timer 36 provides a high signal to OR gate 34 after a predetermined period of time following initiation, causing the OR gate 34 to change state and provide a high signal to AND gate 32. In turn, AND gate 32 issues a high signal that is passed through to buffer driver 22, which then provides an appropriately leveled driving signal to high side switch 12. The feedback signal from the output of AND gate 32 to input of OR gate 34 maintains the OR gate 34 in a high state until such time that the PWM signal changes state, which causes the output of the AND gate 32 to go low.

As discussed above, a drawback of this voltage control delay circuit 20 is that the time delays of the comparators, gates, and driver circuits produce lengthy dead times during which neither switch is conducting. Moreover, the voltage control delay circuit 20 is only responsive to load changes and input voltage changes, but cannot compensate for varying propagation delays in the power supply circuit due to temperature changes or silicon process changes.

Figure 2:
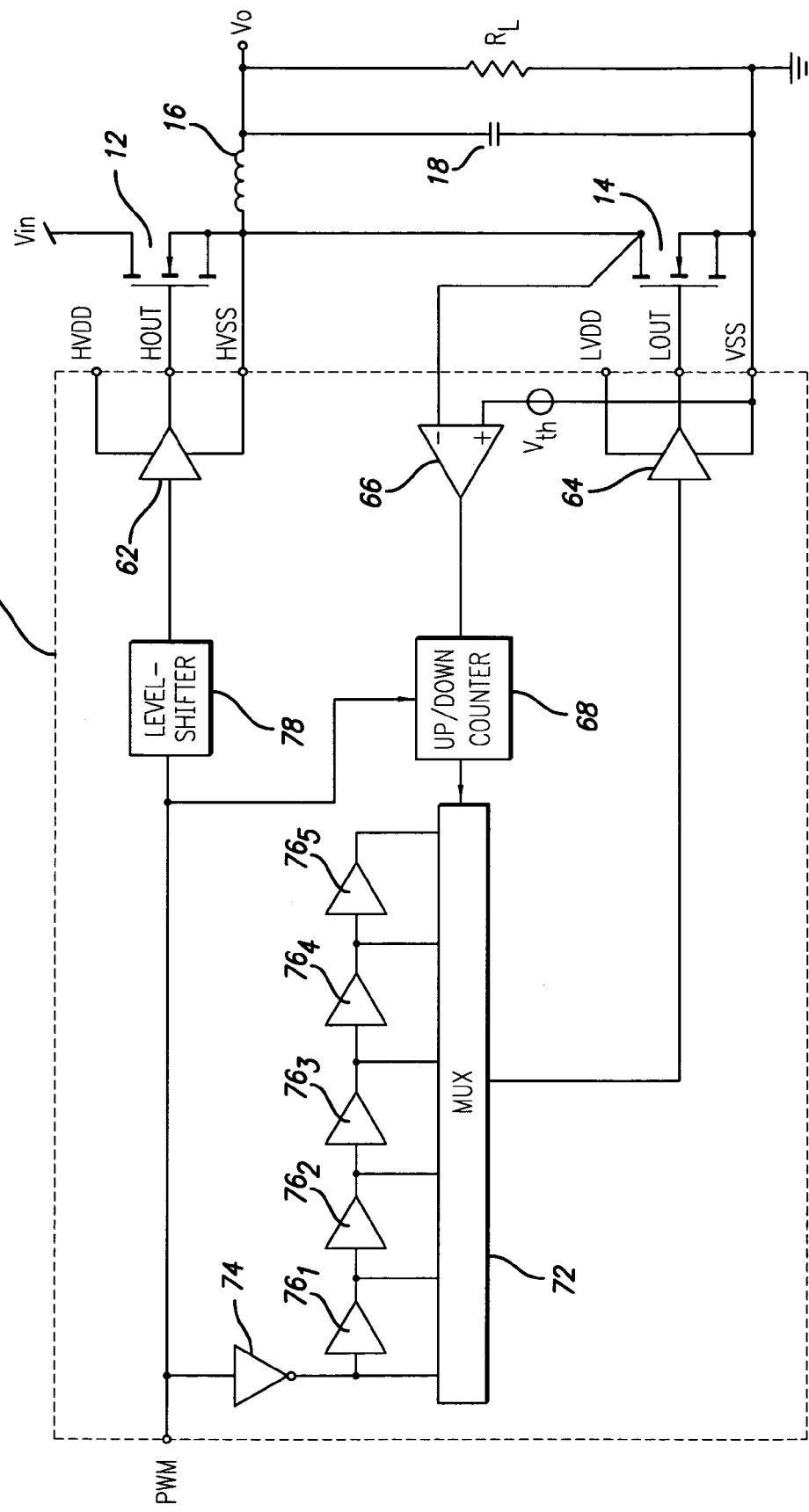
FIG. 2 depicts a switched mode power supply having an adaptive switch driver delay control circuit in accordance with the prior art.

FIG. 2 shows an example of another conventional voltage control delay circuit for a switched mode power supply. As in the preceding example, a voltage control delay circuit 60 is used to delay the delivery of PWM signals to the power switches 12, 14. The voltage control delay circuit 60 includes buffer drivers 62, 64 that provide respective driving signals to the gate terminals of the power switches 12, 14. On the low side, comparator 66 senses the drain-source voltage of the low side switch 14 and compares it to a negative threshold voltage $V_{th}$ corresponding to roughly half of the internal body drain diode forward voltage drop of the low side switch. The comparator 66 generates a signal that indicates whether or not the body drain diode of the low side switch is conducting current. This signal is used to adjust a clocked up/down counter 68, such that the counter counts down when the body drain diode of the low side switch 14 is conducting current prior to the turn on of the low side switch, and counts up when there is no body drain diode conduction in the low side switch. The PWM signal passes through inverter 74 to a delay line comprising a plurality of delay stages $76_1$–$76_5$. The delay stages $76_1$–$76_5$ are each controlled by a multiplexer 72 such that the amount of delay added by the delay stages is determined by the count value defined by the up/down counter 68. The delayed and inverted PWM signal is then provided to the buffer driver 64, which activates the low side switch 14 as substantially described above. The high side would have a similar delay line, multiplexer, up/down counter, and comparator.

An advantage of this voltage delay control circuit is that the low side switch 14 is turned on when the phase voltage reaches zero, regardless of internal or external delays. While the circuit is adaptive, the delay is quantized in that it will always bounce between two delay settings, which therefore introduces noise into the PWM signal and hence the output voltage $V_O$ of the power supply. Also, it is difficult to sense the drain-source voltage of the low side switch 14 to detect the starting point of the body diode conduction due to parasitic inductances. An inaccurate measurement of the zero voltage transition will affect the operation of the control loop. Moreover, the loop filter only considers the direction of the error, but doesn't take into consideration the magnitude of the phase error, since the count value can always change by a maximum of +1 or −1. As a result, the feedback loop settling time is not as fast as would be desirable.

Figure 3:
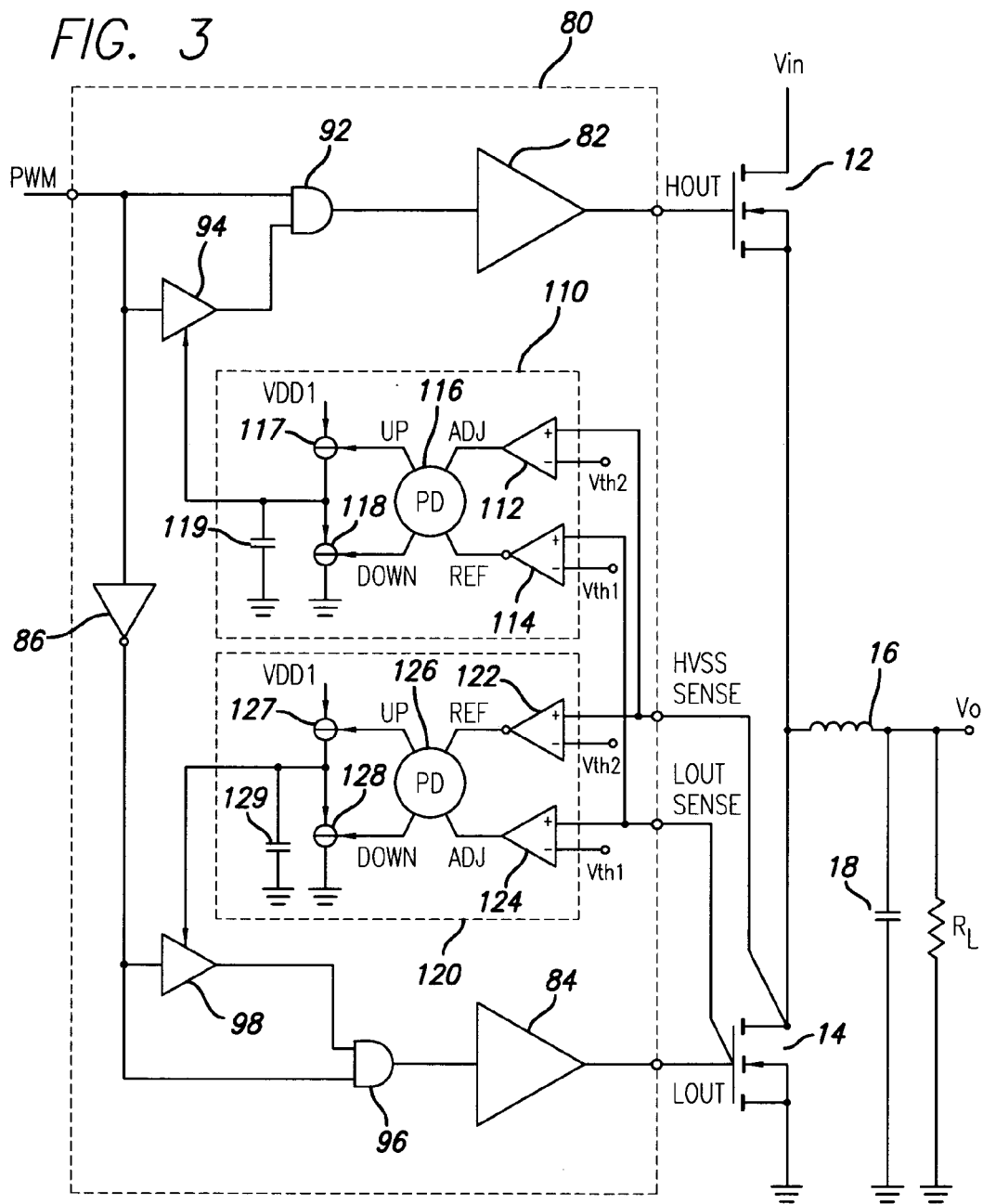
FIG. 3 depicts a switched mode power supply having an adaptive switch driver delay control circuit in accordance with an embodiment of the present invention.

Referring now to FIG. 3, a voltage control delay circuit for a switched mode power supply is illustrated in accordance with an embodiment of the invention. As in the preceding examples, a voltage control delay circuit 80 is used to delay the delivery of PWM signals to the power switches 12, 14. The voltage control delay circuit 80 includes buffer drivers 82, 84 that provide respective driving signals to the gate terminals of the power switches 12, 14. The high side buffer driver 82 is driven by the PWM signal through AND gate 92. Particularly, one input of the AND gate 92 is coupled to the PWM signal and a second input is coupled to variable delay device 94. The high side control circuit 110 determines the amount of delay provided by the variable delay device 94. Thus, when the PWM signal goes high and the variable delay device 94 goes high after a delay period, the AND gate 92 goes high and causes the high side buffer driver 82 to turn on the high side switch 12. Likewise, the low side buffer driver 84 is driven by the inverted PWM signal through AND gate 96. One input of the AND gate 96 is coupled to the inverted PWM signal and a second input is coupled to variable delay device 98. The low side control circuit 120 determines the amount of delay provided by the variable delay device 98. Thus, when the PWM signal goes low (i.e., inverted PWM signal goes high) and the variable delay device 98 goes high after a delay period, the AND gate 96 goes high and causes the low side buffer driver 84 to turn on the low side switch 14.

The high and low side control circuits 110, 120 provide a loop filter that determine the amount of delay to apply to the variable delay devices 94, 98, respectively, by monitoring the phase voltage (HVSS SENSE) and the gate-source voltage of the low side switch 14 (LOUT SENSE). The high side control circuit 110 includes a phase detector 116 that determines the phase error between the signal transitions of the LOUT SENSE and HVSS SENSE, and generates up and down signals that are proportional to the detected phase error. The up and down signals drive a charge pump reflected as current sources 117, 118 that define a voltage across capacitor 119 that provides a control signal to the high side variable delay device 94. Comparator 112 compares the HVSS SENSE to a threshold voltage $V_{th2}$ and provides an adjust (ADJ) signal to the phase detector 116. Comparator 114 compares the LOUT SENSE to a threshold voltage $V_{th1}$ and provides a reference (REF) signal to the phase detector 116. The low side control circuit 120 has similar construction, with phase detector 126 determining the phase error between the signal transitions of the LOUT SENSE and HVSS SENSE. The phase detector 126 generates up and down signals proportional to the detected phase error that drive a charge pump reflected as current sources 127, 128. The charge pump defines a voltage across capacitor 129 that provides a control signal to the low side variable delay device 98. Comparator 122 compares the HVSS SENSE to a threshold voltage $V_{th2}$ and provides a reference (REF) signal to the phase detector 126. Comparator 124 compares the LOUT SENSE to a threshold voltage $V_{th1}$ and provides an adjust (ADJ) signal to the phase detector 126.

Figure 4:
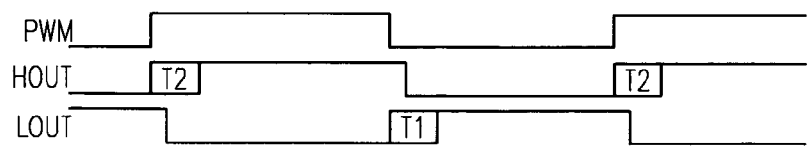
FIG. 4 is a timing diagram depicting control signals provided to high and low side switches of the switched mode power supply of FIG. 3.

FIG. 4 illustrates the driving signals provided to the high side switch 12 (HOUT) and low side switch 14 (LOUT) in relation to the PWM signal. During the time period identified as T1, the high side switch 12 is switched off by the falling edge of the PWM signal and the low side switch 14 is turned on at a time determined by the low side control circuit 120. Similarly, during the time period identified as T2, the low side switch 14 is switched off by the rising edge of the PWM signal and the high side switch 12 is turned on at a time determined by the high side control circuit 110. The variable delay devices 94, 98 can define a delay period that is variable within certain defined parameters so that the delay period can be selected to accommodate changed conditions more rapidly than the incremental approach of the prior art.

More particularly, the high side switch 12 is turned off with the falling transition of the PWM signal. The low side control circuit 120 controls the turn-on time of the low side switch 12 to an optimal value. The output signals of the comparators 122, 124 are provided to the phase detector 126. If the output of comparator 122 leads the output of comparator 124, then the delay is too long and the phase detector 126 generates a down pulse that is proportional to the magnitude of the phase difference between comparator outputs. Conversely, if the output of comparator 124 leads the output of comparator 122, then the delay is too short and the phase detector 126 generates an up pulse that is proportional to the magnitude of the phase difference between comparator outputs. The up and down signals control the current sources 127, 128, respectively, which charge up or discharge down the capacitor 129. The capacitor 129 acts as an integrator that shapes the feedback loop transfer function. The voltage of the capacitor 129 determines the amount of delay provided by variable delay device 98 prior to turn-on of the low side switch 14. The feedback loop will adjust the delay such that the transition of both comparator outputs occurs at the same time. Any additional delay inherent in the switched mode power supply, such as due to operation of the low side buffer driver 84 or the comparators 122, 124, will be compensated for by operation of the voltage control delay circuit. It should be understood that the operation of the high side control circuit 110 is substantially similar.

Figure 5:
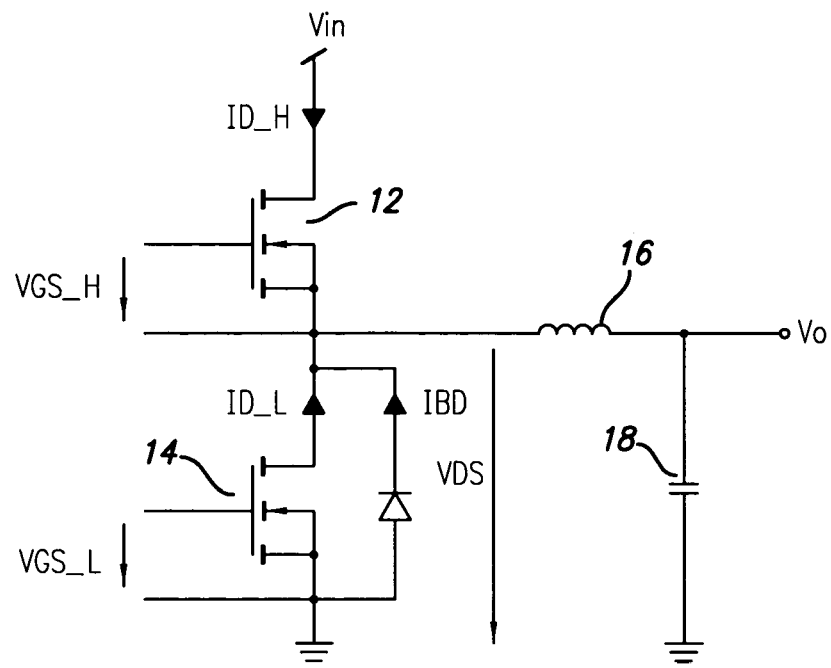
FIG. 5 depicts a portion of a switched mode power supply.
Figure 6:
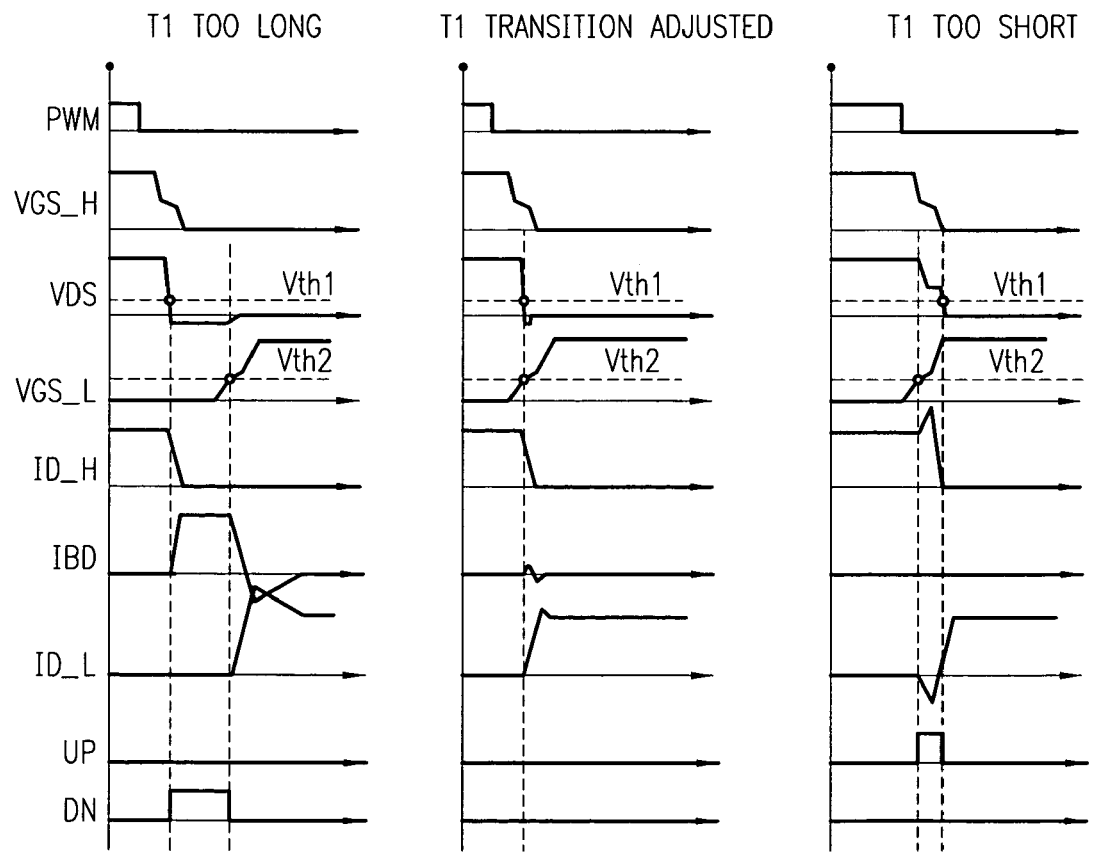
FIG. 6 are voltage and current waveforms measured with respect to the switched mode power supply of FIG. 5 under different operational conditions.

Referring now to FIG. 6, a plurality of voltage and current waveforms are illustrated reflecting various points in the switched mode power supply for three conditions of the low side control circuit 120, namely (a) low side delay (T1) is too long; (b) low side delay is optimally adjusted; and (c) low side delay is too short. FIG. 5 illustrates a portion of the switched mode power supply showing the voltage and current measurement points corresponding to the waveforms of FIG. 6, including the high side current (ID_H), low side current (ID_L), body diode current (IBD), high side switch gate-source voltage (VGS_H), low side switch gate-source voltage (VGS_L), and low side drain-source voltage (VDS). It should be appreciated that the high side control circuit 110 will operate in substantially the same manner to control the turn-on of the high side switch 12.

The left column of FIG. 6 illustrates the case in which the low side delay is too long. It can be seen that a dead time period exists between the switching of the high and low side switches 12, 14. The trailing edge of the high side switch gate-source voltage (VGS_H) waveform reflects the turn-off of the high side switch 12 and the leading edge of the low side switch gate-source voltage (VGS_L) waveform reflects the turn-on of the low side switch 14, with the period therebetween comprising the dead time. During this dead time, the current of the output inductor 16 flows through the body diode of the low side switch 14, as shown by the rise of the body diode current (IBD) waveform during this period. The voltage drop across the body diode as well as the recovery current of the diode results in efficiency reduction of the switched mode power converter. This condition would cause the phase detector 126 of the low side control circuit 120 to generate a down signal that will decrease the magnitude of the time delay for the next switching cycle.

The right column of FIG. 6 illustrates the case in which the low side delay is too short. It can be seen that the high and low side switches 12, 14 are conducting simultaneously. As before, the trailing edge of the high side switch gate-source voltage (VGS_H) waveform reflects the turn-off of the high side switch 12 and the leading edge of the low side switch gate-source voltage (VGS_L) waveform reflects the turn-on of the low side switch 14, with both transitions occurring during the same time period. This simultaneous conduction condition results in excessive shoot through current passing through the high and low switches, as reflected by the current spikes of the high side current (ID_H) and low side current (ID_L) waveforms. The shoot through current reduces the overall efficiency of the switched mode power converter. This condition would cause the phase detector 126 of the low side control circuit 120 to generate an up signal that will increase the magnitude of the time delay for the next switching cycle.

The center column of FIG. 6 illustrates the case in which the delay is ideally selected. The low side control circuit 120 is in a steady state condition in which no up or down signals are generated. Whenever the operating condition changes due to varying load conditions or changes in circuit delays, such as due to temperature changes, the control circuit 120 will readjust the delay to the optimum value. Since there is no quantization, the control circuit 120 adds minimal noise to the effective PWM signal.

While the invention has been described in conjunction with adaptive delay control of a buck converter, it should be appreciated that the adaptive delay control circuit could also be used to control the switch timing of other types of switched mode power supplies, such as but not limited to the rectifying and free-wheeling switches of a synchronous rectifier in a DC/DC converter.

Having thus described a preferred embodiment of an adaptive delay control circuit for a switched mode power supply, it should be apparent to those skilled in the art that certain advantages of the system have been achieved. It should also be appreciated that various modifications, adaptations, and alternative embodiments thereof may be made within the scope and spirit of the present invention. The invention is further defined by the following claims.

What is claimed is:

1. A switched mode power supply comprising:
   a first switch coupled to an input power source;
   a second switch coupled to ground;
   an output filter coupled to a phase node defined between said first and second switches, the first and second switches being responsive to a pulse width modulated signal to thereby regulate power provided to the output filter; and
   a feedback loop controller adapted to adjust operation of said first and second switches in response to changed operating conditions, said controller comprising at least one delay control circuit adapted to delay delivery of said pulse width modulated signal to at least one of said first and second switches to preclude simultaneous conduction of said first and second switches and minimize dead time between state transitions of said first and second switches, said delay control circuit detecting a phase difference between state transitions of said first and second switches and providing a delay in accordance with a magnitude of said phase difference.

2. The switched mode power supply of claim 1, wherein said delay control circuit further comprises a phase detector providing an up or down signal proportional to said phase difference.

3. The switched mode power supply of claim 2, wherein said delay control circuit further comprises a charge pump coupled to said phase detector and converting said up or down signal to a control voltage.

4. The switched mode power supply of claim 3, wherein said delay control circuit further comprises an analog delay device providing a time delay corresponding to said control voltage.

5. The switched mode power supply of claim 3, wherein said delay control circuit further comprises a capacitor coupled to said charge pump, said capacitor integrating said control voltage.

6. The switched mode power supply of claim 1, wherein said at least one delay control circuit further comprises a first delay control circuit associated with said first switch and a second delay control circuit associated with said second switch.

7. The switched mode power supply of claim 1, wherein said input power source comprises an output of a galvanic isolation transformer of a DC-to-DC converter.

8. In a switched mode power supply comprising a first switch coupled to an input power source, a second switch coupled to ground, and an output filter coupled to a phase node defined between said first and second switches, said first and second switches being responsive to a pulse width modulated signal to regulate power delivered to said output filter, a feedback loop controller comprises:
   at least one delay control circuit adapted to delay delivery of said pulse width modulated signal to at least one of said first and second switches to preclude simultaneous conduction of said first and second switches, said delay control circuit detecting a phase difference between state transitions of said first and second switches and providing a delay corresponding to a magnitude of said phase difference.

9. The controller of claim 8, wherein said delay control circuit further comprises a phase detector providing an up or down signal proportional to said phase difference.

10. The controller of claim 9, wherein said delay control circuit further comprises a charge pump coupled to said phase detector and converting said up or down signal to a control voltage.

11. The controller of claim 10, wherein said delay control circuit further comprises an analog delay device providing a time delay corresponding to said control voltage.

12. The controller of claim 10, wherein said delay control circuit further comprises a capacitor coupled to said charge pump, said capacitor integrating said control voltage.

13. The controller of claim 8, wherein said at least one delay control circuit further comprises a first delay control circuit associated with said first switch and a second delay control circuit associated with said second switch.

14. A method of controlling a switched mode power supply comprising a first switch coupled to an input power source, a second switch coupled to ground, and an output filter coupled to a phase node defined between said first and second switches, said first and second switches being responsive to a pulse width modulated signal to regulate power delivered to said output filter, said method comprising:

detecting a phase difference between state transitions of said first and second switches;

generating a variable duration delay in accordance with a magnitude of said phase difference; and delaying delivery of said pulse width modulated signal to at least one of said first and second switches by the variable duration delay;

wherein simultaneous conduction of said first and second switches is precluded and dead time between state transitions of said first and second switches is minimized.

15. The method of claim 14, wherein said generating step further comprises generating an up or down signal corresponding to said phase difference.

16. The method of claim 15, wherein said generating step further comprises increasing or decreasing a control voltage in accordance with said up or down signal, respectively.

17. The method of claim 16, wherein said generating step further comprises converting said control voltage to an analog delay value.

18. The method of claim 17, wherein said generating step further comprises integrating said control voltage.

\* \* \* \* \*